US011393815B2

(12) United States Patent
Lin et al.

(10) Patent No.: US 11,393,815 B2
(45) Date of Patent: Jul. 19, 2022

(54) TRANSISTORS WITH VARYING WIDTH NANOSHEET

(71) Applicant: TAIWAN SEMICONDUCTOR MANUFACTURING CO., LTD., Hsinchu (TW)

(72) Inventors: Yi-Hsiung Lin, Zhubei (TW); Yi-Hsun Chiu, Zhubei (TW); Shang-Wen Chang, Jhubei (TW); Ching-Wei Tsai, Hsinchu (TW); Yu-Xuan Huang, Hsinchu (TW); Kuan-Lun Cheng, Hsinchu (TW); Chih-Hao Wang, Baoshan Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/558,010

(22) Filed: Aug. 30, 2019

(65) Prior Publication Data
US 2021/0066291 A1 Mar. 4, 2021

(51) Int. Cl.
*H01L 29/78* (2006.01)
*H01L 27/092* (2006.01)
*H01L 29/66* (2006.01)
*H01L 29/76* (2006.01)

(52) U.S. Cl.
CPC ...... *H01L 27/092* (2013.01); *H01L 29/66742* (2013.01); *H01L 29/7606* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 9,559,168 B2 | 1/2017 | Lai et al. | |
| 9,768,030 B2 | 9/2017 | Lee | |
| 9,852,785 B2 | 12/2017 | Chih et al. | |
| 9,978,868 B2 | 5/2018 | Lai et al. | |
| 10,043,793 B2 | 8/2018 | Lai | |
| 10,170,413 B2 | 1/2019 | Ohtou et al. | |
| 10,249,756 B2 | 4/2019 | Tu et al. | |
| 2013/0313524 A1* | 11/2013 | De Micheli | H01L 29/0673 257/29 |
| 2016/0204263 A1* | 7/2016 | Mukherjee | H01L 29/66795 257/76 |
| 2016/0254348 A1* | 9/2016 | Bhuwalka | H01L 29/42392 257/288 |
| 2019/0393350 A1* | 12/2019 | Thompson | H01L 29/7855 |
| 2020/0295002 A1* | 9/2020 | Snyder | H01L 29/0673 |

* cited by examiner

*Primary Examiner* — Moin M Rahman
(74) *Attorney, Agent, or Firm* — Finnegan, Henderson, Farabow, Garrett & Dunner, LLP

(57) ABSTRACT

The present disclosure relates to an integrated circuit. In one implementation, the integrated circuit may include a semiconductor substrate; at least one source region comprising a first doped semiconductor material; at least one drain region comprising a second doped semiconductor material; at least one gate formed between the at least one source region and the at least one drain region; and a nanosheet formed between the semiconductor substrate and the at least one gate. The nanosheet may be configured as a routing channel for the at least one gate and may have a first region having a first width and a second region having a second width. The first width may be smaller than the second width.

20 Claims, 7 Drawing Sheets

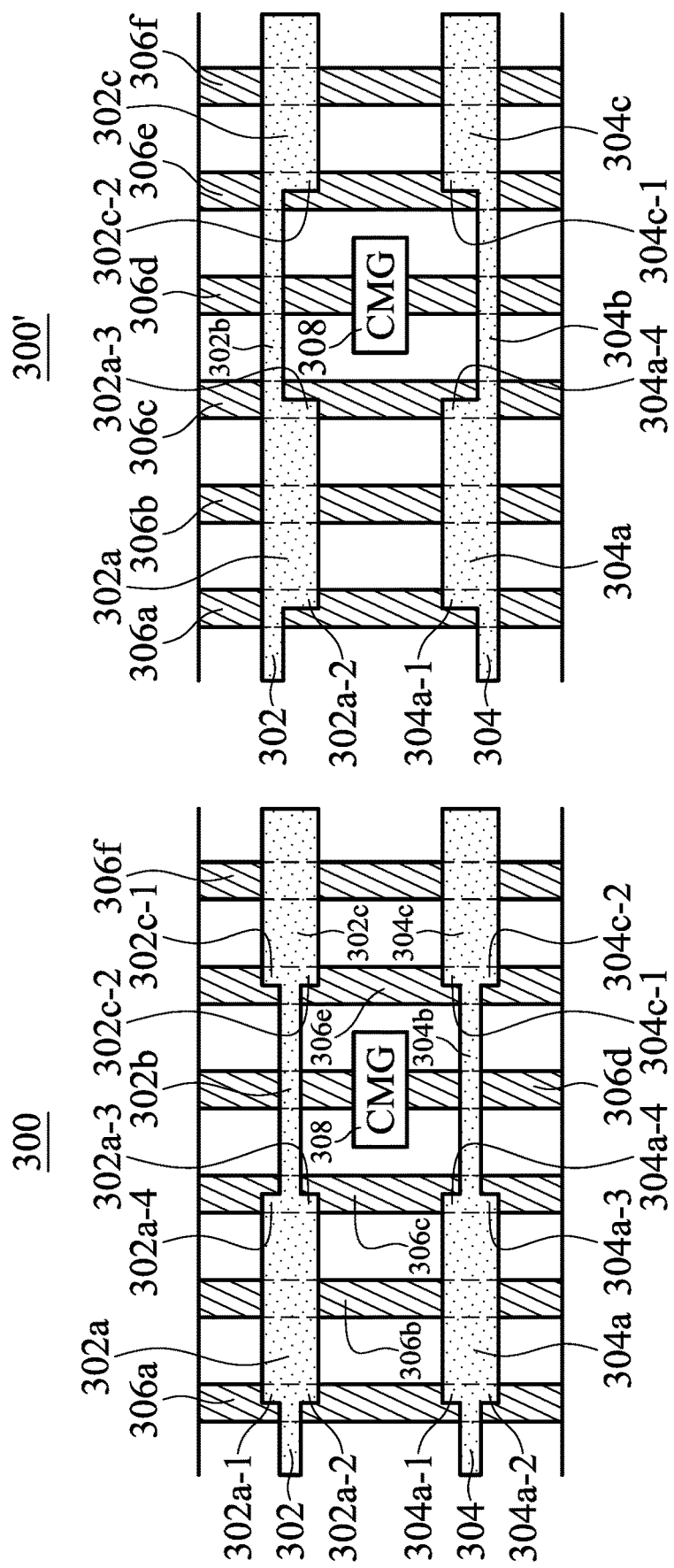

TRANSISTORS WITH VARYING WIDTH NANOSHEET

BACKGROUND

Transistor technologies, such as complementary metal-oxide-semiconductor (CMOS) architectures, fin field-effect transistor (FinFET) architectures, or the like, generally use voltage applied to a gate terminal to increase and decrease current flow between a source region and a drain region. Accordingly, transistors may function as switches based on application of voltage to the gate.

Such transistor technologies also function as logic structures. For example, one or more transistors may be fabricated to form simple gates, such as an AND gate, an OR gate, or the like, or combined to form more complex gates, such as NAND gates, XOR gates, XNOR gates, or the like. These structures generally include interconnect features running between gates, sources, and/or drains of the transistors to connect the transistors. The connections allow for voltages to control the current through the transistors.

In such transistor technologies, the size of the channels has a direct impact on the processing speed of the logic structures as well as the power efficiency of the logic structure. For example, larger channels may enable higher current flow and thus faster processing by the logic structures associated with the larger channels. Such larger channels, however, can require more power. Conversely, smaller channels can promote more energy efficient processing by the logic structure, but carry less current and, therefore, may offer slower processing speeds relative to larger channels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A depicts a nanosheet of varying widths along transistors, in accordance with some embodiments.

FIG. 3B depicts another nanosheet of varying widths along transistors, in accordance with some embodiments.

DETAILED DESCRIPTION

Figure 1:
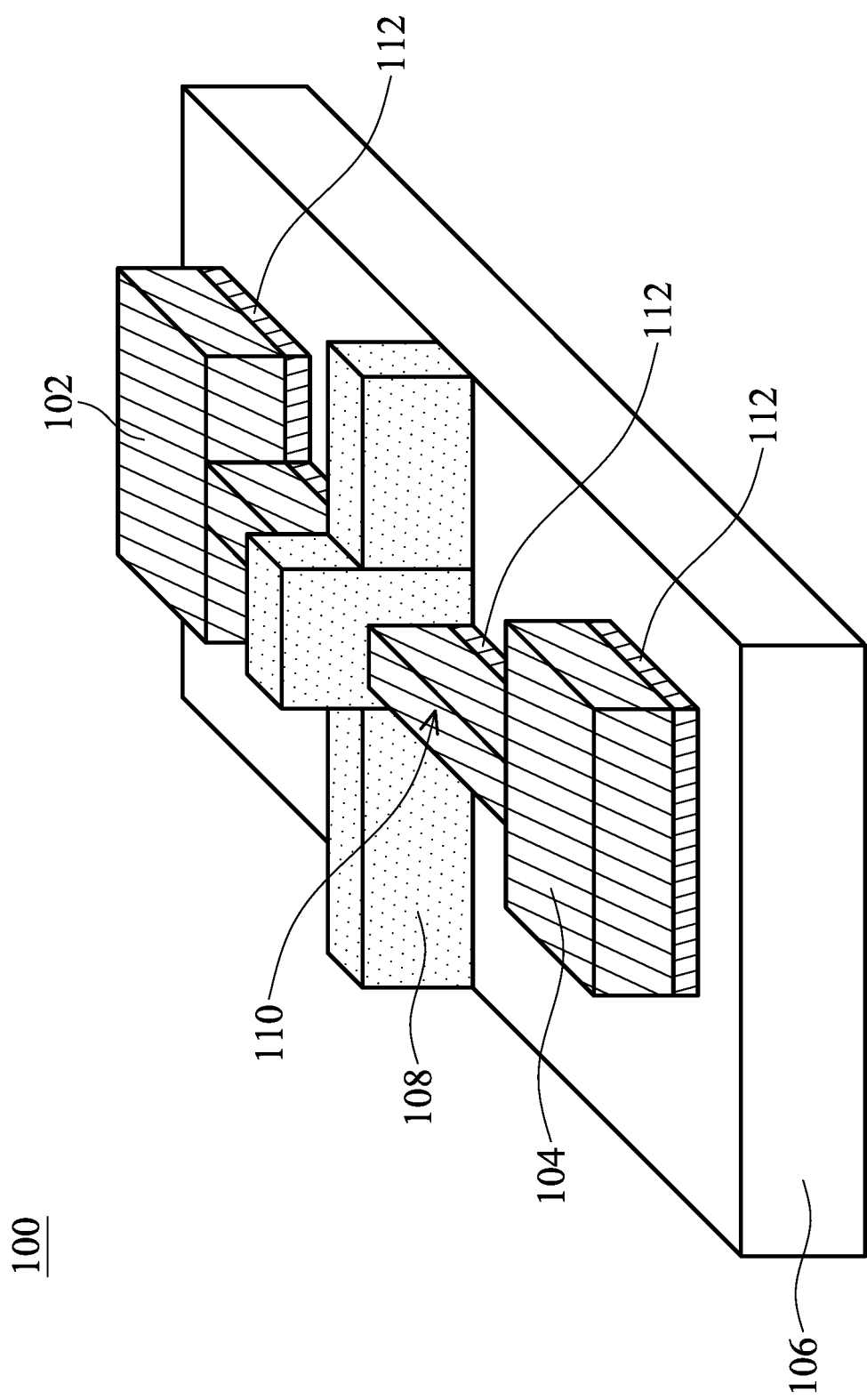
FIG. 1 depicts a fin field-effect transistor (FinFET) with a nanosheet channel, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As depicted in FIG. 1, a fin field-effect transistor (FinFET) 100 generally includes a source feature 104 and a drain feature 102 on a semiconductor substrate 106. In some embodiments, FinFET 100 may comprise N-type metal-oxide-semiconductor (NMOS) transistor. For example, substrate 106 may comprise a p-type substrate with one or more n-type features (e.g., features 102 and 104). In another example, substrate 106 may comprise an n-type substrate including a p-type feature or well on which n-type features (e.g., features 102 and 104) may be formed. In other embodiments, FinFET 100 may comprise a P-type metal-oxide-semiconductor (PMOS) transistor. For example, a substrate 106 may comprise an n-type substrate with one or more p-type features (e.g., features 102 and 104). In another example, substrate 106 may comprise a p-type substrate including an n-type feature or well on which p-type features (e.g., features 102 and 104) may be formed.

As further depicted in FIG. 1, upper surfaces of source feature 104 and drain feature 102 are raised above substrate 106 and electrically connected to gate 108 via one or more fins (e.g., fin 110 connects source 104 to gate 108. The fins may also form part of source feature 104 and drain feature 102, respectively.

Although not depicted in FIG. 1, FinFET 100 may include a corresponding terminal for source feature 104, a corresponding terminal for drain feature 102, and a body terminal. In some embodiments, the body terminal may be formed on the same substrate side as source feature 104 and drain feature 102. Additionally or alternatively, the body terminal may instead be formed on the opposite side of substrate 106.

Gate 108 may comprise a gate dielectric feature of FinFET 100. Gates 108 may comprise a dielectric layer and a metal layer. Gates 108 may allow for use of FinFET 100 by applying a voltage to vary a current between source feature 104 and drain feature 102. The dielectric material used in gate 108 may control one or more properties of the gate 108.

The dielectric layer of gate 108 may comprise silicon dioxide, $HfO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr)$TiO_3$ (BST), $Al_2O_3$, $Si_3N_4$, silicon oxynitrides (SiON), or the like. The metal layer of gate 108 may comprise Ti, Ag, Al, TiAlN, TaC, TaCN, TaSiN, Mn, Zr, TiN, TSN, TaN, Ru, Mo, Al, WN, Cu, W, or the like.

As further depicted in FIG. 1, a nanosheet 112 formed underneath gate 108, source 104, and drain 102 may serve as a current route through FinFET 100. For example, gate 108 is used to provide input voltages (not shown) to FinFET 100 for processing as a logic gate. Nanosheet 112 in FIG. 1 controls current through the logic gate. Thus, the portion of nanosheet 112 underneath gate 108 functions as the channel for FinFET 100. A nanosheet may refer to any material having a thickness of 100 nm or less. A nanosheet may comprise a two-dimensional material, such as graphene, $MoS_2$, or the like. Alternatively, a nanosheet may comprise a thin (100 nm or less) stack of a materials, such as $MoS_2$, silicon, or the like. Although described using silicon, any appropriate semiconductor material or metal may be used as nanosheet 112 in FinFET 100.

FinFETs, such as FinFET 100 of FIG. 1, may be organized on a substrate to form one or more logic structures (e.g., AND gate, an OR gate, a NAND gate, a XOR gates, a XNOR gate, or the like). Embodiments of the present disclosure, such as the examples depicted in FIGS. 2A, 2B, 3A, 3B, and 3C, provide nanosheet channels of different widths along the logic structure.

Figure 2A:
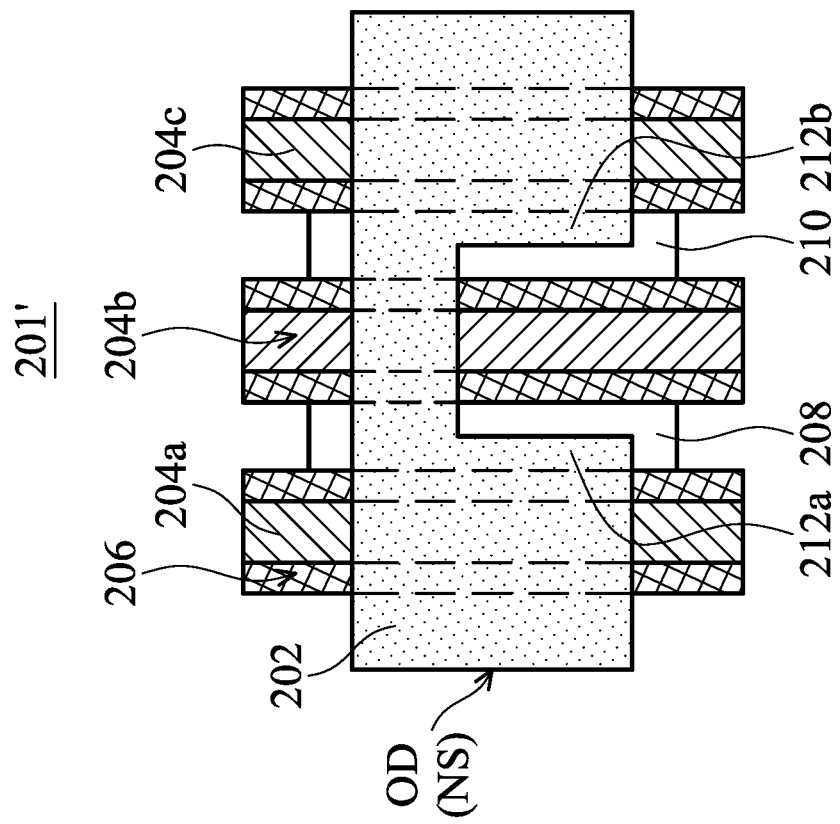
FIG. 2A depicts an arrangement of a nanosheet channel on a logic cell under the gates of the transistors.

As depicted in FIG. 2A, a fin field-effect transistor (Fin-FET) cell 201 includes a nanosheet 202 having a greater width outside gate 204 than under gate 204. As shown in FIG. 2A, nanosheet 202 runs under source 208 and drain 210 as well as under gate 204 (which portion functions as a channel for cell 201). In other embodiments, such as that depicted in FIG. 4 described below, nanosheet channel 202 may run only under gate 204.

As further depicted in FIG. 2A, corners 212*a* and 212*b* of nanosheet 202 may be located under portions of gates (e.g., gates 204*a* and 204*c*). Spacer 206 may comprise a silicon nitride sidewall or any other dielectric or feature between source 208 and drain 210 and corresponding gates (e.g., gates 204*a*, 204*b*, 204*c*, or the like).

Figure 2B:
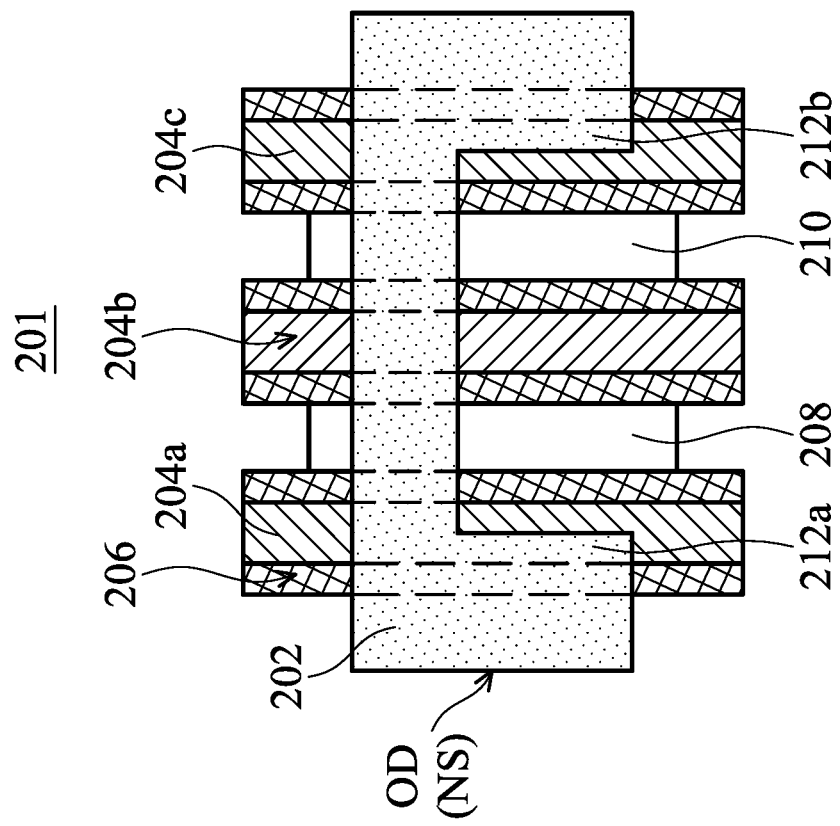
FIG. 2B depicts an arrangement of a nanosheet channel on a logic cell under the sources and the drains of the transistors.

Moreover, although not depicted in FIGS. 2A and 2B, a plurality of isolation trenches (e.g., shallow or deep trenches), a silicon dioxide spacer formed using local oxidation of silicon (LOCOS) techniques, or any other appropriate feature may electrically separate gate 204*b* from other gates (e.g., gates 204*a* and 204*c*). Alternatively, as shown in FinFET cell 200' of FIG. 2B, corners 212*a* and 212*b* of nanosheet 202 may be located under source 208 and/or drain 210.

FIGS. 2A and 2B depict embodiments in which dummy gates 204*a* and 204*c* are provided between gate 204*b* and other gates (not shown) on the same substrate. For example, dummy gates 204*a* and 204*c* may comprise one or more different materials for the corresponding gate dielectric features such that dummy gates 204*a* and 204*c* do not function electrically like actual gates, e.g., gate 204*b*. Additionally or alternatively, dummy gates 204*a* and 204*c* may lack one or more terminals (e.g., a body terminal or the like) such that current running through cell 201 or 201' is not altered by dummy gates 204*a* or 204*b*.

As depicted in FIGS. 2A and 2B, each actual gate, e.g., gate 204*b*, may have one or more dummy gates on either side, thus forming a pattern of actual gates and dummy gates on the corresponding substrate. Moreover, as depicted in FIGS. 2A and 2B, a designer may increase a width of nanosheet 202 under at least part of a dummy gate width (as depicted in FIG. 2A) or under all of a dummy gate width (as depicted in FIG. 2B), or under any portion of a dummy gate. For example, the increased width under a dummy gate may provide for higher current flow across portions of the cell that do not alter the current, such as dummy gates. In some embodiments, the designer may comprise a series of program instructions (e.g., stored on a non-transitory computer-readable medium) that cause one or more processors to execute the instructions to automatically adjust a design for cell 200 or 200' to have increased width for nanosheet 202 when under dummy gates (e.g., gates 204*a* and 204*c*) as compared to a width when under actual gates (e.g., gate 204*b*).

These regions of increased width for nanosheet 202 (e.g., under at least part of one or more dummy gates) may be centered on one or more portions of the structure of cell 200. For example, a region of increased width may be centered on a midpoint of a dummy gate such that one or more corners (e.g., corner 212*a*, 212*b*, or the like) may be located equidistant from the midpoint along one or more dimensions of the cell. Accordingly, nanosheet 202 may have a region of increased width along a length centered on the midpoint of dummy gate 204*a*, 204*c*, or the like. Additionally or alternatively, nanosheet 202 may have a region of increased width whose width is centered on the midpoint of dummy gate 204*a*, 204*c*, or the like.

In other embodiments, the regions of increased width for nanosheet 202 (e.g., under at least part of or all of one or more dummy gates) may be centered on other portions of the structure of cell 200. For example, a region of increased width may be centered on a midpoint of a spacer such that one or more corners (e.g., corner 212*a*, 212*b*, or the like) are equidistant from the midpoint along one or more dimensions of the cell. Accordingly, nanosheet 202 may have a region of increased width along a length centered on the midpoint of spacer 206 or the like. Additionally or alternatively, nanosheet 202 may have a region of increased width centered on the midpoint of spacer 206 or the like. Thus, the designer may center the regions of increased width for nanosheet 202 accordingly.

Similarly, a region of increased width may be centered on a midpoint of a source or drain feature such that one or more corners (e.g., corner 212*a*, 212*b*, or the like) are equidistant from the midpoint along one or more dimensions of the cell. Accordingly, nanosheet 202 may have a region of increased width along a length centered on the midpoint of source 208, drain 210, or the like. Additionally or alternatively, nanosheet 202 may have a region of increased width whose width is centered on the midpoint of source 208, drain 210, or the like. Thus, the designer may be configured center the regions of increased width for nano sheet 202 accordingly.

In embodiments where the logic cell includes a cut metal gate (e.g., as depicted in FIGS. 3A and 3B and explained below), the designer may reduce a width of nanosheet 202 before, under, and/or after the cut metal gate. In some embodiments, a designer tool may automatically reduce nanosheet 202 width based on adjacent layers. Accordingly, the smaller processing area provided by a cut metal gate as compared with a typical gate may be automatically accommodated by the designer tool.

In any embodiments where the designer tool comprises a series of program instructions (e.g., stored on a non-transitory computer-readable medium), the designer tool may receive a data structure defining a logic cell, e.g., by specifying spatial coordinates of gates as well as sources and drains (whether fin features, wells, or the like). The designer tool may use the coordinates in the data structure to determine one or more coordinates setting boundaries for a nanosheet. Accordingly, the coordinates may be used by one or more manufacturing devices (such as an e-beam lithography machine or the like) to deposit the nano sheet in determined locations during manufacturing of the logic cell. The designer tool may determine the locations using any of the mechanisms described above.

FIG. 3A depicts a plurality of gates (306a, 306b, 306c, 306d, 306e, and 306f) arranged in a logic cell 300. Nanosheets 302 and 304 connect gates 306a, 306b, 306c, 306d, 306e, and 306f to route current signals through the gates and allow the gates to perform processing on the signals. As shown in FIG. 3A, nanosheet channels 302 and 304 have first regions 302a and 304a, respectively, each having a first width. Moreover, nanosheet channels 302 and 304 have second regions 302b and 304b, respectively, each having a second width. In the example of FIG. 3A, the second width is smaller than the first width such that processing of current signals in gates 306c, 306d, and 306e is slower than in gate 306b, but power efficiency is greater than in gate 306b. In an alternative embodiment, the second width may be larger than the first width.

As further depicted in FIG. 3A, nanosheet channels 302 and 304 have third regions 302c and 304c, respectively, each having a third width. In the example of FIG. 3A, the third width is larger than the second width such that processing in gate 306f is faster than in 306c, 306d, and 306e but power efficiency is lower than in gates 306c, 306d, and 306e. In an alternative embodiment, the third width may be smaller than the second width. Moreover, although the example of FIG. 3A depicts the third width as equal to the first width, other embodiments may include a third width smaller than the first width or larger than the first width.

FIG. 3A depicts nanosheet channels 302 and 304 with four corners 302a-1, 302a-2, 302a-3, and 302a-4 bounding region 302a and four corners 304a-1, 304a-2, 304a-3, and 304a-4 bounding region 304a, respectively. Similarly, nanosheet channels 302 and 304 have four corners 302a-4, 302c-1, 302a-3, and 302c-2 bounding region 302b and four corners 304a-4, 304c-1, 304a-3, and 304c-2 bounding region 304b, respectively. In an alternative embodiment depicted in logic structure 300' FIG. 3B, nanosheet channels 302 and 304 may instead include two corners between regions. For example, FIG. 3B depicts two corners 302a-2 and 302a-3 bounding region 302a, and two corners 304a-1 and 304a-4 bounding region 304a, respectively. Similarly, FIG. 3B depicts two corners 302a-3 and 302c-2 bounding region 302b, and two corners 304a-4 and 304c-1 bounding region 304b, respectively.

As further depicted in FIGS. 3A and 3B, one or more gates of structure 300 or 300' may include a cut metal gate 308. Moreover, as depicted in FIGS. 3A and 3B, and explained above, structure 300 or 300' may include narrower portions 302b and 304b of nanosheets 302 and 304, respectively, before, under, and after cut metal gate 308. Such reduced width may accommodate a smaller processing window provided by cut metal gate 308 as compared to gates 306a, 306b, 306c, 306e, and 306f, which are not cut in FIGS. 3A and 3B.

Having nanosheet channels 302 and 304 with different widths under different gates 306a-306f, as shown in FIGS. 3A and 3B may improve the device power consumption, speed, and integration density. For example, having asymmetric portions for nanosheet channels 302 and 304 may improve device speed because a designer may select to have a wider nanosheet in portions that require enhanced speed. Alternatively, or additionally, asymmetric portions for nanosheets 302 may improve power consumption by segregating devices to reduce overall power consumption. For example, if the speed from a device with a large nanosheet channel 302 width (e.g., 21 nm) can be comparable to two devices with smaller nanosheet channel 302 width (e.g, 12 nm), a user may have the flexibility to design two devices instead of one to minimize power consumption associated with larger devices. Moreover, the possibility to have multiple widths in nanosheet channels 302 and 304 may facilitate integration with other processes, such as deposition of cut metal gate 308. For example, the width of nanosheet channels 302 and 304 may be reduced in portions in which cut metal gate 308 will be deposited, facilitating fabrication steps and minimizing potential overlaps.

Alternatively, or additionally, the selection of nanosheet channel 302 width may be guided by density considerations. For example, when power considerations are not relevant for a specific configuration, a designed may select to have a wide portion of nanosheets 302 that combines the function of multiple devices. In such embodiments, large nanosheet channel 302 (e.g., width 21 nm) can be treated as 2-fin devices. Such consolidation increases the process window available because generally space & width for multiple devices requires additional patterning/layout room than a single large device. Accordingly, extra layout space could be used to reduce cell height of cells fabricated with nanosheet channel 302.

Overall, the flexibility provided by the disclosed devices varying width nanosheet widths benefit area, design, and gain. The disclosed devices can have multiple widths for specific portions of circuits and for targeted applications. For example, nanosheets 302 widths may range between widths of 2, 2.1, 3.5, 4.25 nodes until 30 nm nodes.

Figure 3C:
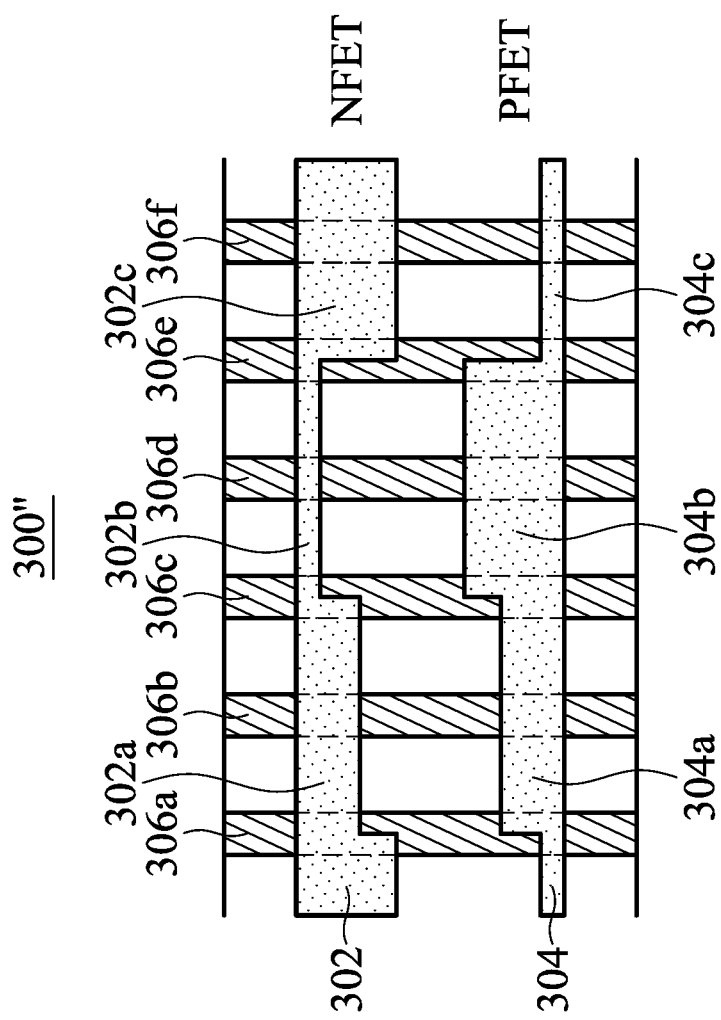
FIG. 3C depicts yet another nanosheet of varying widths along transistors, in accordance with some embodiments.

FIGS. 3A and 3B depict nanosheet channels 302 and 304 with symmetric variations in width, at least with respect to an axis along which gates 306a, 306b, 306c, 306d, 306e, and 306f are oriented. In an alternative embodiment depicted in logic structure 300" of FIG. 3C, for example, nanosheet channels 302 and 304 may have asymmetric variations in width, at least with respect to the axis along which gates 306a, 306b, 306c, 306d, 306e, and 306f are oriented. For example, the second width of region 302b in FIG. 3C is smaller than the first width while the second width of region 304b in FIG. 3C is larger than the first width. Furthermore, the third width of region 302c in FIG. 3C is larger than the second width while the third width of region 304c in FIG. 3C is smaller than the second width. In some embodiments, as depicted in FIG. 3C, asymmetric embodiments may allow for tuning of a nanosheet channel 302 for the NMOS field-effect transistor (NFET) portions of the substrate individually of a nanosheet channel 304 for the PMOS field-effect transistor (PFET) portions of the substrate.

The embodiments of FIGS. 3A, 3B, and 3C may be combined. For example, the four cornered embodiment of FIG. 3A may be applied in the asymmetric embodiment of FIG. 3C. In such an example, nanosheets 302 and 304 of FIG. 3C may have four corners between regions 302a and 302b and between regions 304a and 304b, respectively, and/or between regions 302b and 302c and between regions 304b and 304c, respectively. Moreover, although FIGS. 3A, 3B, and 3C are depicted with three regions, any number of regions may be used in nanosheet channels 302 and 304.

Figure 4:
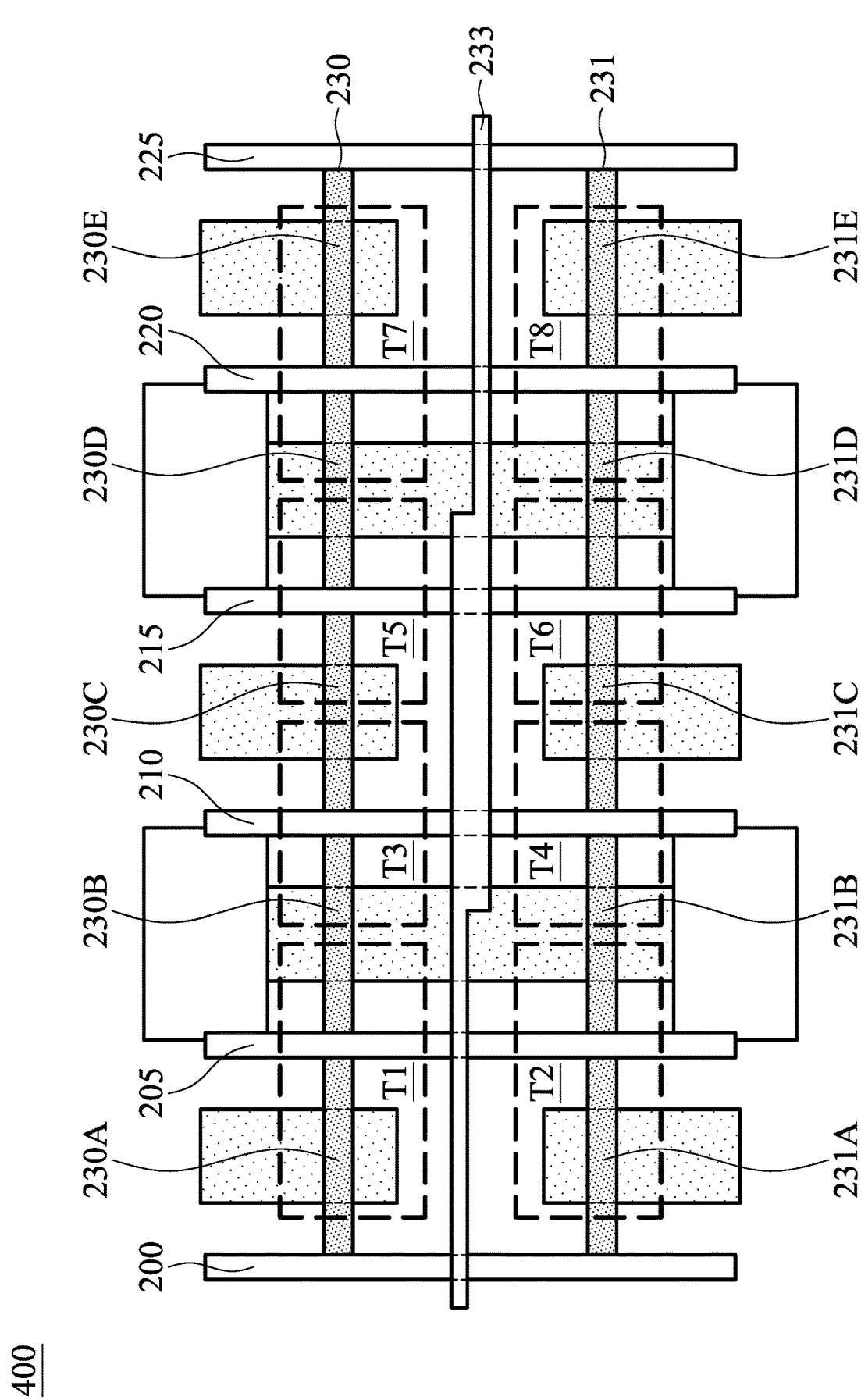
FIG. 4 depicts a logic structure with a plurality of a FinFET gates connected through a nanosheet, in accordance with some embodiments.

FIG. 4 depicts another logic structure 400, including a FinFET architecture like that depicted in FIG. 1. As depicted in FIG. 4, transistors T1, T2, T3, T4, T5, T6, T7, and T8 are configured with gates 205, 210, 215, and 220, respectively. Additional gates 200 and 225 are further depicted for structure 400. Gates 200, 205, 210, 215, 220, and 225 may each comprise may comprise a dielectric layer and a metal layer. For example, the dielectric layer may comprise silicon dioxide, HfO$_2$, LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfSiO, (Ba, Sr)TiO$_3$ (BST), Al$_2$O$_3$, Si$_3$N$_4$, silicon oxynitrides (SiON), or the like. The metal layer may comprise T1, Ag, Al, TiAlN, TaC, TaCN, TaSiN, Mn, Zr, TiN, TSN, TaN, Ru, Mo, Al, WN, Cu, W, or the like.

Similar to FIG. 1, structure 400 further includes fin features 230 and 231. For example, fin features 230 and 231 may form sources and drains shared between the plurality of gates (e.g., gates 200, 205, 210, 215, 220, and 225). Accordingly, fin component 230A may comprise a first source or drain of transistor T1, and fin component 230B may comprise a second source or drain of transistor T1. Thus, fin component 230A, gate 205, and fin component 230B together may comprise transistor T1. Similarly, fin component 231B may comprise a first source or drain of transistor T2, and fin component 231A may comprise a second source or drain of transistor T2. Thus, fin component 231B, gate 205, and fin component 231A together may comprise transistor T2. Similarly, fin component 230C may comprise a first source or drain of transistor T3, and fin component 230B may comprise a second source or drain of transistor T3. Thus, fin component 230C, gate 210, and fin component 230B together may comprise transistor T3. Similarly, fin component 231B may comprise a first source or drain of transistor T4, and fin component 231C may comprise a second source or drain of transistor T4. Thus, fin component 231B, gate 210, and fin component 231C together may comprise transistor T4. Similarly, fin component 230C may comprise a first source or drain of transistor T5, and fin component 230D may comprise a second source or drain of transistor T5. Thus, fin component 230C, gate 215, and fin component 230D together may comprise transistor T5. Similarly, fin component 231D may comprise a first source or drain of transistor T6, and fin component 231C may comprise a second source or drain of transistor T6. Thus, fin component 231D, gate 215, and fin component 231C together may comprise transistor T6. Similarly, fin component 230E may comprise a first source or drain of transistor T7, and fin component 230D may comprise a second source or drain of transistor T7. Thus, fin component 230E, gate 220, and fin component 230D together may comprise transistor T7. Similarly, fin component 231D may comprise a first source or drain of transistor T8, and fin component 231E may comprise a second source or drain of transistor T8. Thus, fin component 231D, gate 220, and fin component 231E together may comprise transistor T8.

As further depicted in FIG. 4, nanosheet 233 may thus electrically connect the gates 200, 205, 210, 215, 220, and 225 to an input and an output (not shown). In the embodiment depicted in FIG. 3, nanosheet 233 is located under gates 200, 205, 210, 215, 220, and 225. Thus, portions of nanosheet 112 under gates 200, 205, 210, 215, 220, and 225 may function as a channel for those gates of cell 400.

FIG. 4 depicts nanosheet 233 with three different widths along the length of cell 400. However, any number of widths may be used. For example, nanosheet 233 may have one width corresponding to each pair of gates (as depicted in FIG. 4) or may have one width corresponding to each individual gate (not shown). Other embodiments may include alternating widths. For example, a first width corresponding to a single gate, a second width corresponding to a pair of gates, and so on. Alternatively, cell 400 may include nanosheet 233 with a first width corresponding to a pair of gates, a second width corresponding to a triplet of gates, and so on. Alternatively or additionally, nanosheet 233 may include a first width corresponding to a triplet of gates, a second width corresponding to a single gate, and so on; or the like.

As further depicted in FIG. 4, width changes may be accompanied by either an L-shape (as depicted between gates 215 and 220) or a U-shape (as depicted between gates 205 and 210). Accordingly, any of the patterns above may further include alterations between L-shaped and U-shaped interfaces at width changes of nanosheet 233.

Moreover, as depicted in FIG. 4, nanosheet 233 may not extend under any portion of the fins 230 or 231. However, in some embodiments not depicted in FIG. 4, nanosheet 233 may instead extend under at least a portion of the fins, of source 104, and/or of drain 108. Indeed, in comparison with other approaches, varying the width of nanosheet 233 allows nanosheet 233 to extend under at least a portion of some fins and not others. Similarly, in comparison with other approaches, varying the width of nanosheet 233 allows nanosheet 233 to extend over (or under) different portions of fin features along a length of structure 400.

Although described with respect to nanosheets, embodiments of the present disclosure may include three-dimensional structures, such as nanotubes or nanowires, for conveying current through gates of a logic structure. In such embodiments, two dimensions, such as height and radius of the nanotube, may vary along its length rather than, as with nanosheets, one dimension, such as width.

Figure 5A:
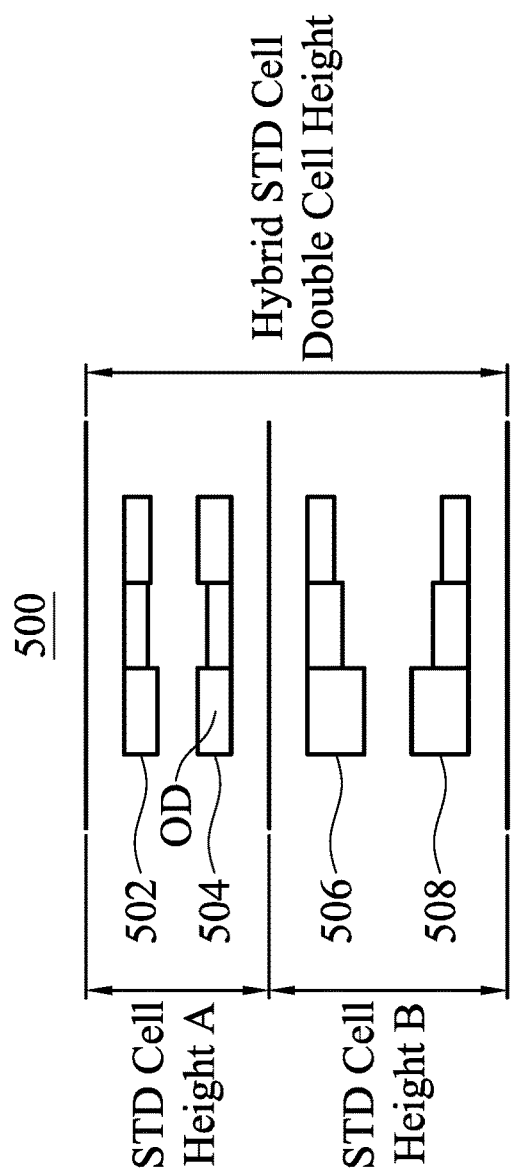
FIG. 5A depicts a nanosheet of varying heights along transistors, in accordance with some embodiments.

In addition to varying widths, nanosheet channels of the present disclosure may have varying heights along a length of the substrate. As depicted in FIG. 5A, for example, logic structure 500 includes nanosheet channels 502 and 504 with different heights corresponding to different regions of logic structure 500. For example, the heights may vary for different gates of logic structure 500.

Moreover, logic structures of the present disclosure may be stacked. As further depicted in FIG. 5A, logic structure 500 may include a first cell with nanosheet channels 502 and 504 stacked on a second cell with nanosheet channels 506 and 508. Similar to nanosheet channels 502 and 504, nanosheet channels 506 and 508 may electrically connect cells of different heights corresponding to different regions of logic structure 500. For example, the heights may vary for different gates of logic structure 500.

In one example, a height of nanosheet channel 502 and/or a height of nanosheet channel 504 may be reduced at a gate of a FinFET with two fins (e.g., FinFET 100 of FIG. 1) relative to another gate of a second FinFET with only one fin while a width at the gate of the FinFET with two fins is larger relative to the other gate of the second FinFET with only fin. Accordingly, a processing speed at the gate of the FinFET with two fins may be maintained by taking advantage of the additional width provided by the extra fin while reducing a height of the channel to increase a density of a stacked cell using the logic structure.

In another example, a height of nanosheet channel 502 and/or a height of nanosheet channel 504 may be increased at a gate of a FinFET with one fin. Accordingly, a processing speed at the gate may be increased without adding an additional fin, allowing for a stacked cell including the logic structure to have a narrower width yet a taller height. Depending on the hardware in which the stacked cell is used, a taller yet narrower cell may fit within the existing hardware more readily.

Figure 5B:
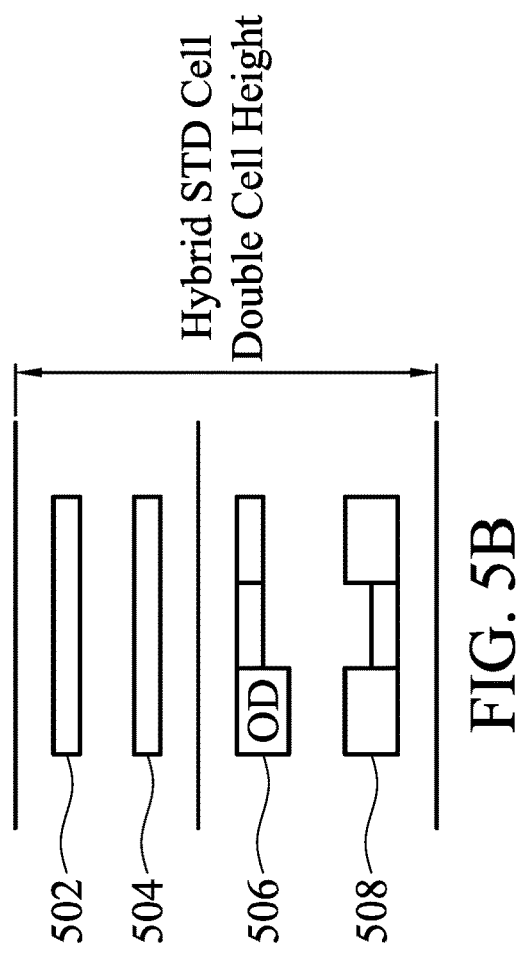
FIG. 5B depicts another nanosheet of varying heights along transistors, in accordance with some embodiments.

Moreover, not all cells within the stack must have varying heights. In the example logic structure 500' of FIG. 5B, nanosheet channels 502 and 504 of the first cell have a constant height while nanosheet channels 506 and 508 of the second cell have different heights corresponding to different regions of logic structure 500. Similar to advantages derived from varying widths of nanosheet channels in transistors, varying heights of nanosheet channels in transistors may allow for tuning of processing speed and power efficiency at different gates of the first cell and at different gates of the second cell.

Figure 6:
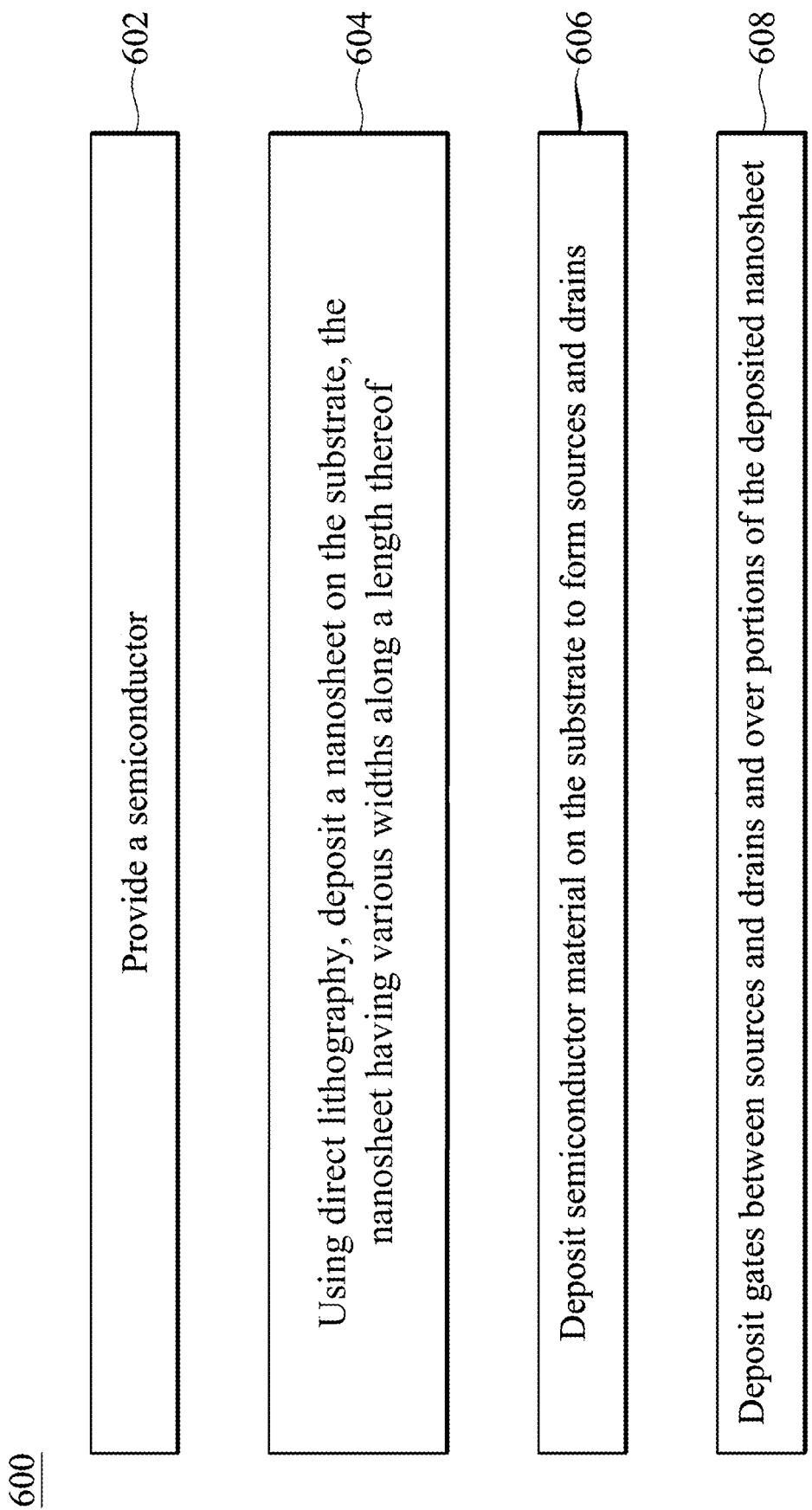
FIG. 6 is a flowchart of a process for forming a FinFET with a nanosheet of varying widths, in accordance with some embodiments.

FIG. 6 depicts a method 600 of forming a FinFET (e.g., FinFET 100 of FIG. 1) or any array of FinFETs (e.g., logic structures 300, 300', or 300" of FIG. 3A, 3B, or 3C, respectively, or logic structure 400 of FIG. 4) with a nanosheet channel of varying widths. Although described with reference to portions of FIG. 1, method 600 is not limited to the embodiment depicted in FIG. 1.

As depicted in FIG. 6, method 600 may include providing a semiconductor substrate (e.g., substrate 106). For example, the semiconductor substrate 106 may comprise silicon or other semiconductor materials. In some embodiments, the semiconductor substrate 106 may comprise a plurality of semiconductors in a composite. In other embodiments, the semiconductor substrate 106 may comprise a one or more polymers, such as nylon or the like; a layered silicon-insulator-silicon substrate (e.g., in embodiments using silicon-on-insulator (SOI) technology); or the like.

In some embodiments, substrate 106 may include shallow trench isolation regions between regions intended for the transistors. Any suitable lithography technique may be used to form the trenches. Additionally or alternatively, as explained above, deep trench isolation, local oxidation of silicon (LOCOS), or other isolation technologies may be used in addition to or alternatively to shallow trench isolation.

In some embodiments, method 600 may further include using direct lithography to deposit a nanosheet (e.g., nanosheet 112) on substrate 106. By using direct lithography, the nanosheet may have various widths along a length of the nanosheet rather than a constant width. For example, by depositing the nanosheet using electron beam lithography, direct laser writing, or any other maskless lithography may provide greater control over the width of the nanosheet deposited as compared with lithography that relies on mask-based techniques with a photoresist.

However, although described using direct lithography, mask-based photolithography techniques may be used to deposit the semiconductor materials. For example, a photomask may be used to selectively deposit the semiconductor materials. Alternatively, a photoresist may be deposited over the substrate 106 and selectively removed (e.g., via ultraviolet light or other radiation) such that the semiconductor materials may be deposited and then selectively etched with the remaining photoresist. In some embodiments, a sacrificial layer (e.g., silicon dioxide, silicon nitride, or the like) may be deposited and then selectively etched with the photoresist.

In any of the embodiments described above, an image layer may form a surface for nanosheet 112. For example, the image layer may comprise oxide, oxynitride, HfSiO, or the like. In such embodiments, the image layer may serve to promote adhesion of deposited layers (such as nanosheet 112) to substrate 106 and/or provide hydrophilic properties such that water does not interfere with the bonding between nanosheet 112 and substrate 106. For example, the image layer may comprise Bis(trimethylsilyl)amine (HMDS) that promotes adhesion to substrate 106 and/or reacts with silicon dioxide on the surface of substrate 106 to form a water-repelling layer of tri-methylated silicon-dioxide.

Method 600 may further include depositing semiconductor materials on substrate 106 to form sources (e.g., source 104) and drains (e.g., drain 102). For example, the features may be deposited with spin coating techniques, epitaxial growth, or any other deposition techniques. Similar to nanosheet 112, source 104 and drain 102 may be deposited using direct lithography.

Alternatively, mask-based photolithography techniques may be used to deposit the semiconductor materials. For example, a photomask may be used to selectively deposit the semiconductor materials. Alternatively, a photoresist (e.g., a nitride or the like) may be deposited over the substrate 106 and selectively removed (e.g., via ultraviolet light or other radiation) such that the semiconductor materials may be deposited and then selectively etched with the remaining photoresist. In some embodiments, a sacrificial layer (e.g., silicon dioxide, silicon nitride, or the like) may be deposited and then selectively etched with the photoresist.

In some embodiments, method 600 may further include depositing gates (e.g., gate 108) between the sources (e.g., source 104) and the drains (e.g., drain 102) and above portions of the deposited nanosheet 112.

In any of the embodiments described above, an image layer may form a surface for gate 108. For example, the image layer may comprise oxide, oxynitride, HfSiO, or the like.

Accordingly, embodiments of the present disclosure may provide a logic structure having a nanosheet comprising a channel with varying widths along the substrate of the logic structure. For example, the nanosheet may have smaller widths over some gates and larger widths over other gates. In some embodiments, direct lithography may be used to vary the width of the nanosheet with sufficient accuracy. By using a nanosheet of varying widths, embodiments of the present disclosure may provide tunability of processing speed (by using larger widths) for certain gates and power efficiency (by using smaller widths) for other gates. Moreover, the tuning of NMOS gates and PMOS gates in a CMOS structure may be performed independently, allowing for greater flexibility in designing CMOS chips. In some simulations, tuning by adjusting widths of channel nanosheets provided a power boost between 2 and 20% and a processing speed boost between 5 and 25% as compared with transistors having nanosheet channels of constant width. For example, one or more gates of the tunable logic structure may have a wider and/or taller nanosheet channel to increase processing speed while other gates of the tunable logic structure may have a wider and/or taller nanosheet channel to increase power efficiency. Accordingly, by tuning the gates of the logic structure accordingly, the entire structure may exhibit the power boosts and/or processing speed increases described above.

In one embodiment, an integrated circuit may comprise a semiconductor substrate; at least one source region comprising a first doped semiconductor material; at least one drain region comprising a second doped semiconductor material and at least one gate formed between the at least one source region and the at least one drain region. The integrated circuit may further comprise a nanosheet formed between the semiconductor substrate and the at least one gate. The nanosheet may be configured as a channel for the at least one gate, and may have a first region having a first width and a second region having a second width, wherein the first width is smaller than the second width.

In one embodiment, a method of fabricating an integrated circuit may comprise providing a semiconductor substrate and, using direct lithography, depositing a nanosheet on the substrate. The nanosheet may have various widths along a length of the nanosheet. The method may further comprise depositing semiconductor materials on the substrate to form sources and drains and depositing gates between the sources and the drains and above portions of the deposited nanosheet.

In one embodiment, a fin field-effect transistor may comprise a semiconductor substrate; at least one source region comprising semiconductor material doped to form an n-type region; and at least one drain region comprises semiconductor material doped to form a p type region. The at least one source region may have a height greater than a height of the semiconductor substrate, and the at least one drain region may have a height greater than the height of the semiconductor substrate. The transistor may further comprise at least one gate formed between the at least one source region and the at least one drain region, and the at least one gate may have a height greater than the height of the semiconductor substrate. The transistor may further comprise a nanosheet formed between the semiconductor substrate and the at least one gate, between the semiconductor substrate and the at least one source region, and between the semiconductor substrate and the at least one drain region. The nanosheet may have a first region with a first width under the at least one gate and a second region with a second width under the at least one source region and the at least one drain region. The first width may be different than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a semiconductor substrate;
   at least one source region comprising a first doped semiconductor material;
   at least one drain region comprising a second doped semiconductor material;
   at least one gate including a first gate;
   a first spacer and a second spacer respectively formed at two sides of the first gate; and
   a nanosheet formed between the semiconductor substrate and the at least one gate and between the semiconductor substrate and the at least one source region, and configured as a channel for the at least one gate,
   wherein:
      the nanosheet has a first region having a first width and a second region having a second width, the first width being less than the second width; and
      the nanosheet has a corner under the first gate.

2. The integrated circuit of claim 1, wherein the nanosheet comprises a two-dimensional material.

3. The integrated circuit of claim 1, wherein the at least one gate comprises a plurality of gates, and the at least one source region is shared between the plurality of gates.

4. The integrated circuit of claim 1, wherein the at least one gate comprises a plurality of gates, and the at least one drain region is shared between the plurality of gates.

5. The integrated circuit of claim 1, wherein the at least one source region is raised above a surface of the semiconductor substrate.

6. The integrated circuit of any of claim 1, wherein the at least one drain region is raised above a surface of the semiconductor substrate.

7. The integrated circuit of claim 1, wherein the at least one gate is raised above a surface of the semiconductor substrate.

8. The integrated circuit of claim 1, wherein the at least one source has at least two regions, a first region having a third width wider than a width of the at least one gate and a second region having a fourth width narrower than the width of the at least one gate.

9. The integrated circuit of claim 1, wherein the at least one drain has at least two regions, a first region having a third width wider than a width of the at least one gate and a second region having a fourth width narrower than the width of the at least one gate.

10. The integrated circuit of claim 1, wherein:
    the corner is a first corner;
    the at least one gate further includes a second gate; and
    the nanosheet further includes a second corner under the second gate.

11. The integrated circuit of claim 1, wherein the corner is formed by a narrowing of at least one dimension of the nanosheet under the first gate.

12. The integrated circuit of claim 1, further comprising:
    at least one additional source region comprising the first doped semiconductor material;
    at least one additional drain region comprising the second doped semiconductor material; and
    at least one additional gate formed between the at least one additional source region and the at least one additional drain region,
    the at least one gate forming part of a first logic cell and the at one additional gate forming part of a second logic cell.

13. The integrated circuit of claim 12, wherein at least a portion of the first region of the nanosheet is located under the at least one gate and at least a portion of the second region of the nanosheet is located under the at least one additional gate.

14. The integrated circuit of claim 12, wherein a first height of the first logic cell including the first region of the nanosheet differs from a second height of the second logic cell including the second region of the nanosheet.

15. The integrated circuit of claim 1, wherein a first height of the first region of the nanosheet differs from a second height of the second region of the nanosheet.

16. A fin field-effect transistor, comprising:
    a semiconductor substrate;
    at least one source region comprising semiconductor material doped to form an n-type region, the at least one source region having a height greater than a height of the semiconductor substrate;
    at least one drain region comprising semiconductor material doped to form a p type region, the at least one drain region having a height greater than the height of the semiconductor substrate;
    at least one gate having a height greater than the height of the semiconductor substrate; and
    a nanosheet formed between the semiconductor substrate and the at least one gate, between the semiconductor substrate and the at least one source region, and between the semiconductor substrate and the at least one drain region, wherein the nanosheet has a first region with a first width under the at least one gate and a second region with a second width under the at least one source region and the at least one drain region, the first width being different than the second width.

17. The integrated circuit of claim 1, wherein:
the first spacer separates the at least one source region from the at least one gate; and
the nanosheet runs under the first spacer.

18. The integrated circuit of claim 17, wherein:
the second spacer separates the at least one drain region from the at least one gate; and
the nanosheet runs under the second spacer.

19. The integrated circuit of claim 18, wherein:
the first spacer and the second spacer each comprise a silicon nitride wall; and
the nanosheet comprises at least one of graphene or molybdenum disulfide.

20. A semiconductor device comprising:
a substrate;
one or more source regions;
one or more drain regions;
one or more gates including a first gate;
a first spacer and a second spacer respectively formed at two sides of the first gate; and
at least one nanosheet formed between the substrate and the one or more gates, between the substrate and the one or more source regions, and between the substrate and the one or more drain regions, the at least one nanosheet having a first region with a first width under the first gate and a second region with a second width under the one or more source regions and the one or more drain regions, the first width being narrower than the second width.

* * * * *